US006937103B2

(12) United States Patent
Inagaki

(10) Patent No.: US 6,937,103 B2
(45) Date of Patent: Aug. 30, 2005

(54) VOLTAGE GENERATING CIRCUIT

(75) Inventor: Yasuhiko Inagaki, Atsugi (JP)

(73) Assignee: Mitsumi Electric Co., Ltd. (JP)

( * ) Notice: Subject to any disclaimer, the term of this patent is extended or adjusted under 35 U.S.C. 154(b) by 9 days.

(21) Appl. No.: 10/789,256

(22) Filed: Feb. 27, 2004

(65) Prior Publication Data

US 2005/0024031 A1 Feb. 3, 2005

(30) Foreign Application Priority Data

Jul. 30, 2003 (JP) ....................................... 2003-282845

(51) Int. Cl.[7] ................................................ H03F 3/04

(52) U.S. Cl. ....................................... 330/297; 330/282

(58) Field of Search ................................. 330/297, 282, 330/51, 149, 207 R; 381/120, 121, 123, 94.1, 94.5

(56) References Cited

U.S. PATENT DOCUMENTS 5,642,074 A 6/1997 Ghaffaripour et al.
6,346,854 B1 * 2/2002 Heithoff ..................... 330/149

* cited by examiner

*Primary Examiner*—Shawn Riley
(74) *Attorney, Agent, or Firm*—Anderson Kill & Olick, PC

(57) ABSTRACT

A voltage generating circuit for generating an output voltage according to an input voltage is arranged to be able to generate the output voltage with desired rise characteristics. The voltage generating circuit includes a resistor circuit that is serially implemented with respect to the input voltage, a condenser unit that cooperates with the resistor circuit to generate the output voltage, a digital delay circuit that delays at least one of a rise and a fall of the input voltage and generates a delay output based thereon, and a bypass circuit that controls bypassing of a predetermined resistor included in the resistor circuit according to the delay output from the digital delay circuit.

5 Claims, 7 Drawing Sheets

OFF
ON

OFF
ON
t0
t1
t2

VOLTAGE GENERATING CIRCUIT

BACKGROUND OF THE INVENTION

1. Field of the Invention

The present invention relates generally to a voltage generating circuit, and particularly to a voltage generating circuit that generates an output voltage according to an input voltage.

2. Description of the Related Art

An audio amplifier circuit that amplifies an audio signal and outputs the amplified signal to a speaker or a headphone is known in the conventional art.

Such an audio amplifier circuit has a shutdown function and a mute function for cutting noise upon turning the power on/off.

FIG. 1 is a circuit diagram showing an exemplary configuration of a conventional audio amplifier circuit 101.

In this audio amplifier circuit 101, an input signal is supplied to an input terminal Tin via a condenser C41 that cuts direct current from a signal source 102. The input signal supplied to the input terminal Tin is then supplied to an amplifier circuit 111. The amplifier circuit 111 includes a differential amplifier circuit 121, an input resistor R31, a return resistor R32, and a switch 122. The amplifier circuit 111 corresponds to an inverting amplifier circuit that receives a standard voltage from a standard voltage generating circuit 112.

The amplifier circuit 111 outputs a signal according to a difference between the standard voltage from the standard voltage generating circuit 112 and the input signal supplied to the input terminal Tin. The signal amplified at the amplifier circuit 111 is output from an output terminal Tout to drive a speaker 103.

The switch 122 is implemented between a connection point of the input resistor R31 and the return resistor R32, and an inverting input terminal (−) of the differential amplifier circuit 121, and this switch 122 turns on/off by a mute signal that is supplied to a control terminal Tcnt1 from a controller 104. In this way, the supplying of the input signal to the differential amplifier circuit 121 may be controlled, and in turn, the mute function may be controlled.

The standard voltage generating circuit 112 includes a switch 131, resistors R41 and R42, and a condenser C51. A fixed voltage Vdd is applied to the standard voltage generating circuit 112. Specifically, the fixed voltage Vdd is applied via the switch 131 to a series circuit that includes the resistors R41 and R42. The switch 131 turns on when a shutdown signal supplied from the controller 104 to a control terminal Tcnt2 is at a high level, in which case the fixed voltage Vdd is applied to the series circuit including the resistors R41 and R42. The switch 131 turns off when the shutdown signal is at a low level in which case the supplying of the fixed voltage Vdd to the series circuit including the resistors R41 and R42 is stopped.

When the switch 131 turns on, the resistors R41 and R42 divide the voltage Vdd, generate the standard voltage, and supply the generated standard voltage to a non-inverting input terminal (+) of the differential amplifier circuit 121. In this way, the amplifier circuit may be in an operating state. It is noted that, a terminal Tc is connected to a connection point of the resistor R41 and the resistor R42, and the terminal Tc is connected to a condenser C51 that is implemented outside the audio amplifier circuit 101. The condenser C51 externally connected to the terminal Tc absorbs ripples of the standard voltage.

FIGS. 2A~2E are diagrams illustrating the operation of the audio amplifier circuit 101. FIG. 2A represents the shutdown signal that is output from the controller 104, FIG. 2B represents the switching state of the switch 131, FIG. 2C represents the standard voltage that is supplied to the differential amplifier circuit 121, FIG. 2D represents the mute signal that is output from the controller, and FIG. 2E represents the switching state of the switch 122.

When the level of the shutdown signal changes from low to high at time t10 as is shown in FIG. 2A, the switch 131 turns on as is shown in FIG. 2B. When the switch 131 turns on, the standard voltage is generated by the resistors R41 and R42. In this case, the standard voltage gradually rises according to the charge voltage of the condenser C51, and reaches a predetermined level at time t11 as is shown in FIG. 2C. When the standard voltage reaches the predetermined level at time t11, the differential amplifier circuit 121 may be ready for operation.

The controller 104 counts up the time from when the shutdown signal is switched to a high level, and, after a predetermined amount of time elapses, outputs a mute signal at time t12, as is shown in FIG. 2D. With the output of the mute signal, the switch 122 of the amplifier circuit 111 turns on, as is shown in FIG. 2E, and the mute state of the input signal is disengaged so that the input signal may be amplified at the amplifier circuit 111 and supplied to the speaker 103.

As can be appreciated from the above description, in the audio amplifier circuit 101, the generation of the standard voltage at the standard voltage generating circuit 112, the operation of the amplifier circuit 111, and the shutdown function of the amplifier circuit 111 are controlled based on the shutdown signal from the controller 104. Further, the mute function of the amplifier circuit 111 is controlled based on the mute signal from the controller 104.

In another example, an audio amplifier circuit that controls a generation of a standard voltage of an amplifier circuit according to a standby signal is proposed in U.S. Pat. No. 5,642,074.

However, in the conventional audio amplifier circuit, there is a delay in the rise of the standard voltage with respect to the input of the shutdown signal owing to the condenser C51 for absorbing ripples.

Thus, the rise time of the standard voltage is lengthened, and the audio output is delayed.

SUMMARY OF THE INVENTION

The present invention has been conceived in consideration of the problems of the related art, and its object is to provide a voltage generating circuit that is capable of generating an output voltage with desired rise characteristics.

According to one aspect of the present invention, there is provided a voltage generating circuit that generates an output voltage according to an input voltage, the voltage generating circuit including:

a resistor circuit that is serially implemented with respect to the input voltage;

a condenser unit that cooperates with the resistor circuit to generate the output voltage;

a digital delay circuit that delays at least one of a rise and a fall of the input voltage and generates a delay output based thereon; and a bypass circuit that controls bypassing of a predetermined resistor included in the resistor circuit according to the delay output of the delay circuit.

In another embodiment of the present invention, the resistor circuit may include a plurality of resistors that are serially connected; and the bypass circuit may establish parallel connection with the predetermined resistor that is to be bypassed, and may include a switch that is switched on/off according to the delay output of the digital delay circuit.

In another embodiment of the present invention, the delay output of the digital delay circuit may control the bypassing of the predetermined resistor to be performed for a period of time during which the output voltage generated according to the input voltage is rising.

In another embodiment of the present invention, the bypass circuit may control bypassing of a plurality of resistors included in the resistor circuit according to delay outputs of a plurality of digital delay circuits having differing delay times set thereto.

Also, in another aspect of the present invention, there is provided a method of generating an output voltage according to an input voltage, wherein a resistor circuit is serially implemented with respect to the input voltage, the method including the steps of:

delaying at least one of a rise and a fall of the input voltage and generating a delay output based thereon;

controlling bypassing of one or more resistors included in the resistor circuit according to the delay output; and adjusting a rise of the output voltage during bypass of the one or more resistors.

According to an aspect of the present invention, one or more resistors may be bypassed in order to adjust the rise of the output voltage being generated. In this way, the rise of the output voltage may be adjusted according to the characteristics of ensuing circuits so that the ensuing circuits may be operated at high speed without generation of shock and noise, for example.

DETAILED DESCRIPTION OF THE PREFERRED EMBODIMENTS

In the following, principles and embodiments of the present invention will be described with reference to the accompanying drawings.

Figure 1:
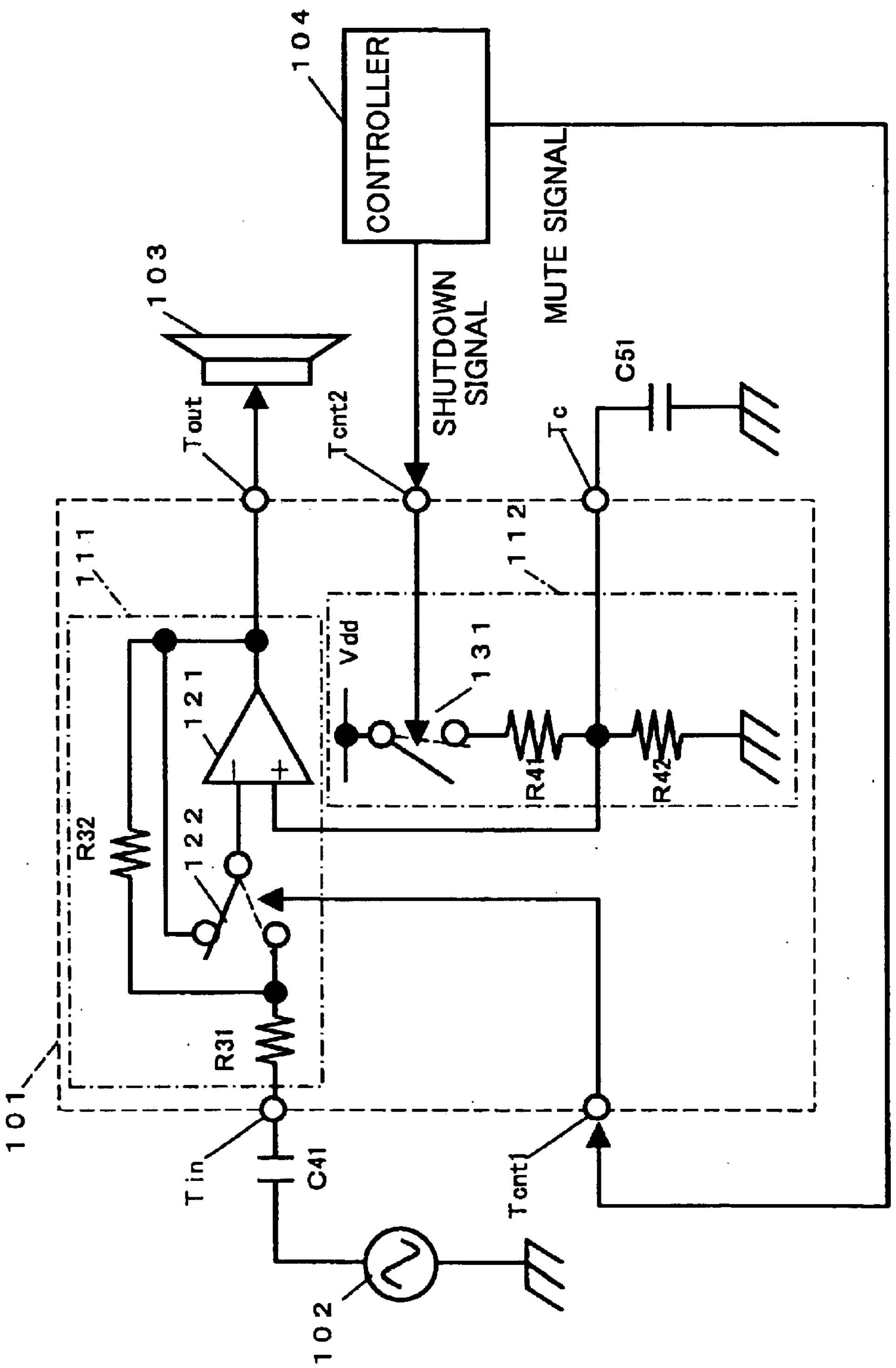
FIG.1 PRIOR ART
FIG. 1 is a circuit diagram illustrating a configuration of an audio amplifier circuit according to the related art.
Figures 2A, 2B, 2C, 2D, 2E:
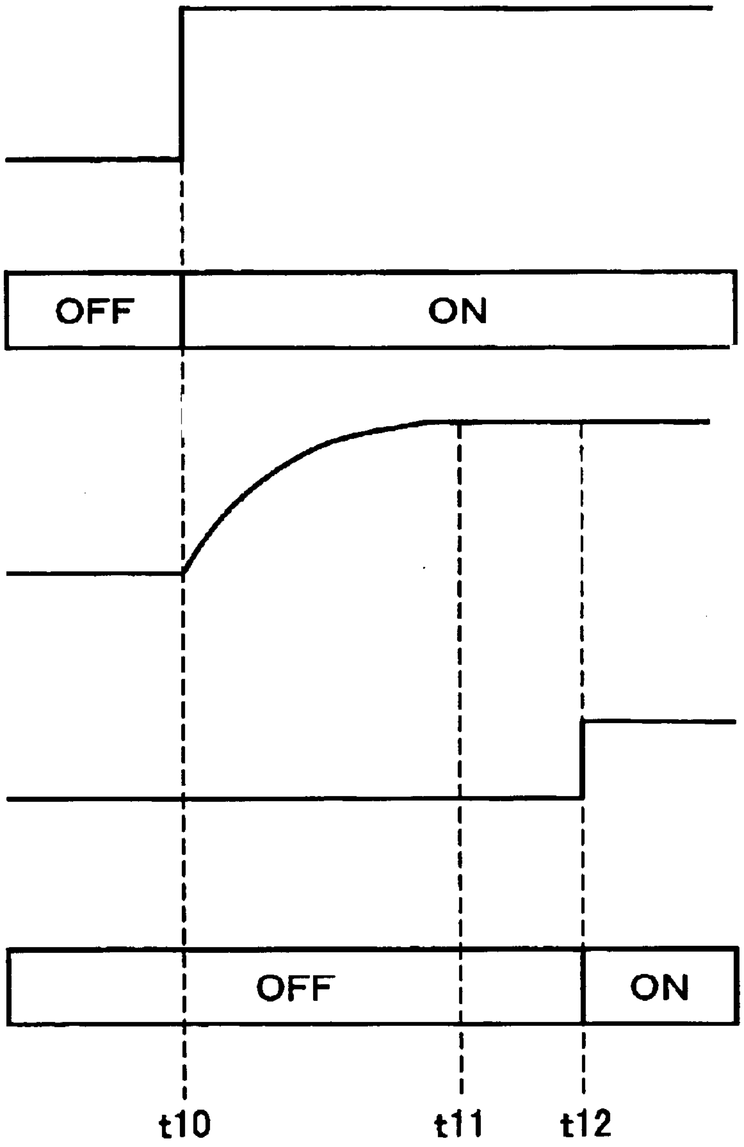
PRIOR ART FIG.2A
FIGS. 2A~2E are diagrams illustrating an operation of the audio amplifier circuit of FIG. 1.
Figure 3:
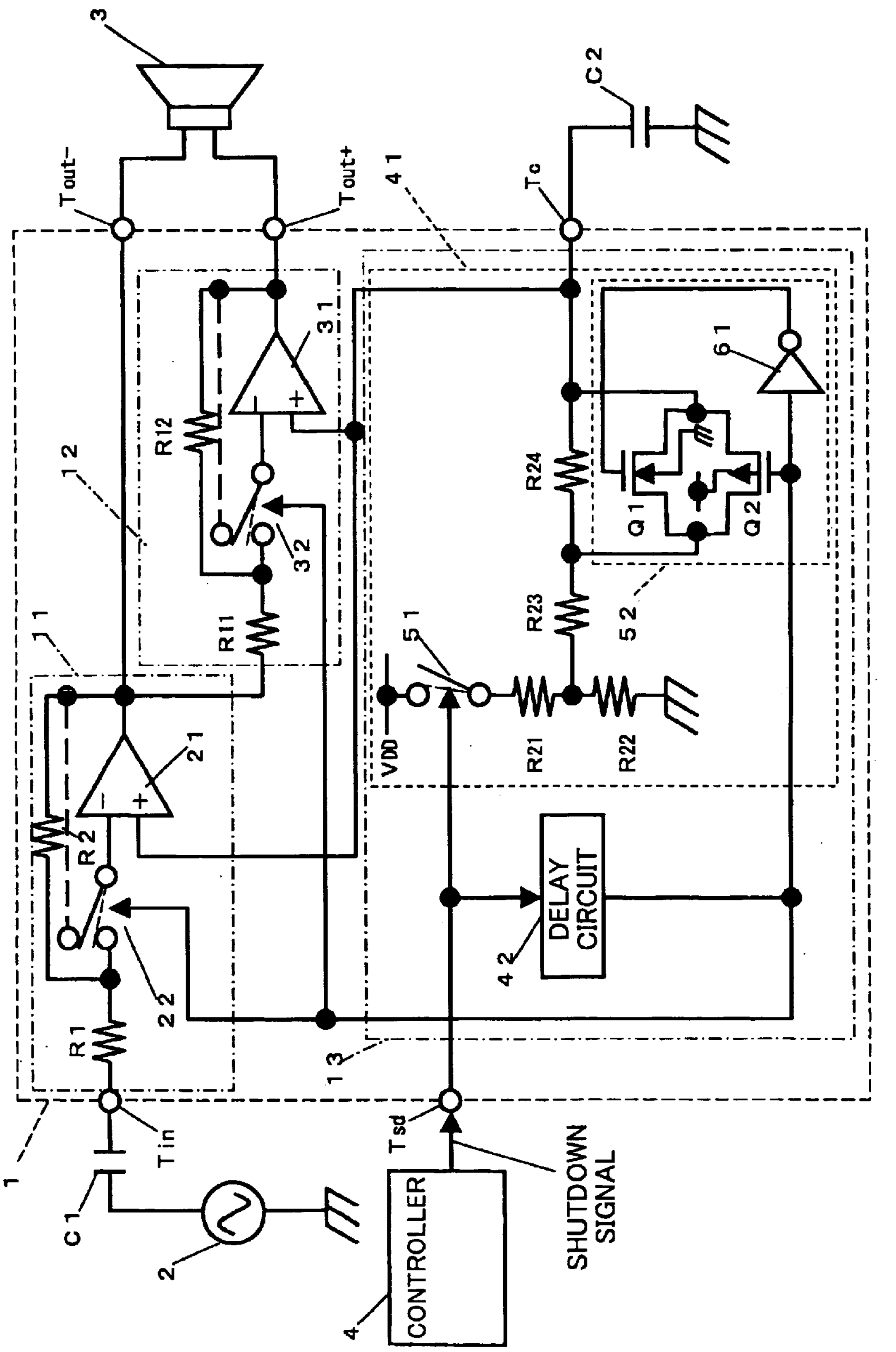
FIG. 3 is a circuit diagram illustrating a configuration of a signal output circuit according to an embodiment of the present invention.

FIG. 3 is a circuit diagram illustrating a configuration of a signal output circuit according to an embodiment of the present invention.

The signal output circuit 1 according to the present embodiment corresponds to a one-chip semiconductor integrated circuit that includes amplifier circuits 11 and 12, and a function control circuit 13. Also, the signal output circuit 1 implements an input terminal Tin, output terminals Tout−, Tout+, and terminals Tsd and Tc as external terminals. An input signal is supplied to the input terminal Tin from a signal source 2 via a condenser C1. A shutdown signal is supplied to the terminal Tsd from a controller 4. A speaker 3 is implemented between the inverting output terminal Tout− and the non-inverting output terminal Tout+. A condenser C2 is connected to the terminal Tc.

The signal supplied to the input terminal Tin is amplified at the amplifier circuit 11. The amplifier circuit 11 corresponds to an inverting amplifier circuit that includes resistors R1 and R2, a differential amplifier circuit 21, and a switch circuit 22. The amplifier circuit 11 inverts and amplifies the input signal supplied to the input terminal Tin, and outputs the resulting amplified signal.

The switch circuit 22 corresponds to a circuit for realizing the mute function, and is implemented between a connection point of the input resistor R1 and the return resistor R2, and an inverting input terminal of the differential amplifier circuit 21. The switch circuit 22 turns off when a mute signal supplied from the function control circuit 13 is at a low level, and turns on when the mute signal is at a high level. When the switch circuit 22 turns on, the connection point of the input resistor R1 and the return resistor R2 is short-circuited with the inverting input terminal of the differential amplifier circuit 21 so that the input signal may be supplied to the inverting input terminal of the differential amplifier circuit 21. In this way, the mute state of the amplifier circuit 11 is disengaged so that the input signal may be inverted and amplified.

When the switch circuit 22 turns off, the connection point of the input resistor R1 and the return resistor R2 and the inverting input terminal of the differential amplifier circuit 21 may be set apart, that is, the output terminal and the inverting input terminal of the differential amplifier circuit 21 may be short-circuited as is illustrated by the dashed line in FIG. 3. In this way, the amplifier circuit 11 may control the input signal to be muted.

The output signal of the amplifier circuit 11 is output from the inverting output terminal Tout−, and supplied to the amplifier circuit 12.

The amplifier circuit 12 corresponds to a differential amplifier circuit that includes resistors R11 and R12, a differential amplifier circuit 31, and a switch circuit 32. The amplifier circuit 12 inverts and amplifies the signal input thereto from the amplifier circuit 11, and outputs the resulting signal via the non-inverting output terminal Tout+.

The switch circuit 32 corresponds to a circuit for realizing the mute function, and is implemented between the connection point of the input resistor R11 and the return resistor R12, and a non-inverting input terminal of the differential amplifier circuit 31. The switch circuit 32 turns off when the mute signal supplied from the function control circuit 13 is at a low level, and turns on when the mute signal is at a high level. When the switch circuit 32 turns on, the connection point of the input resistor R11 and the return resistor R12 is short-circuited with the inverting input terminal of the differential amplifier circuit 31 so that the input signal may be supplied to the inverting input terminal of the differential amplifier circuit 31. In this way, the mute state of the input signal at the amplifier circuit 12 is disengaged so that the input signal may be inverted and amplified.

When the switch circuit 32 turns off, the connection point of the input resistor R1 and the return resistor R2 and the inverting input terminal of the differential amplifier circuit 21 may be set apart, or the output terminal and the inverting input terminal of the differential amplifier circuit 21 may be short-circuited. In this way, the amplifier circuit 12 may control the input signal to be muted.

The output signal of the amplifier circuit 12 is output to the inverting output terminal Tout+.

The shutdown signal from the controller 4 is supplied to the terminal Tsd. The controller 4 may invert the level of the shutdown signal from low to high, for example. The shutdown signal supplied from the controller 4 to the terminal Tsd is supplied to the function control circuit 13.

The function control circuit 13 includes a standard voltage generating circuit 41 and a delay circuit 42. The standard voltage generating circuit 41 corresponds to a circuit for realizing the shutdown function and includes a switch 51, resistors R21~R24, and a bypass circuit 52. Also, the condenser C2 is externally connected to the standard voltage generating circuit 41 via the terminal Tc.

The switch 51 turns on when the shutdown signal is at a high level, and turns off when the shutdown signal is at a low level. When the switch 51 turns on, a fixed voltage Vdd is applied to a series circuit that includes the resistors R21 and R22. The fixed voltage Vdd is divided into voltages for the respective resistors R21 and R22, and the divided voltages are output to the respective resistors R21 and R22 from the connection point of the resistors R21 and R22.

The connection point of the resistors R21 and R22 is connected to the non-inverting input terminals of the differential amplifier circuit 21 of the amplifier circuit 11 and the differential amplifier circuit 31 of the amplifier circuit 12. The connection point of the resistor R24 and the non-inverting input terminals of the differential amplifier circuit 21 of the amplifier circuit 11 and the differential amplifier circuit 31 of the amplifier circuit 12, is connected to the terminal Tc.

The condenser C2 that is externally connected to the terminal Tc absorbs ripples of the standard voltage applied to the non-inverting input terminals of the differential amplifier circuit 21 of the amplifier circuit 11 and the differential amplifier circuit 31 of the amplifier circuit 12.

When the switch 51 turns on, the applied currents of the non-inverting input terminal of the differential amplifier circuit 21 and the inverting input terminal of the differential amplifier circuit 31 rise after a predetermined delay time that is based on a time constant that is determined by the resistors R23 and R24 and the condenser C2. Thus, the activation of the amplifier circuits 11 and 12 is delayed. In turn, to quicken the activation of the amplifier circuits 11 and 12, the bypass circuit 52 is implemented so that the resistor R24 may be bypassed when the switch 51 turns on.

The bypass circuit 52 includes MOS field effect transistors Q1 and Q2 that make up a CMOS (complementary metal oxide semiconductor), and an inverter 61. The bypass circuit 52 may correspond to a transfer gate that forms a channel for bypassing the resistor 24. An output of the delay circuit 42 is applied to the gates of the MOS field effect transistors Q1 and Q2. The MOS field effect transistors Q1 and Q2 turn on when the output of the delay circuit 42 is at a low level, and the MOS field effect transistors Q1 and Q2 are turned off when the output of the delay circuit 42 changes from low to high level after a predetermined delay time.

Thus, the bypass circuit 52 is activated when the shutdown signal rises and the switch 51 turns on. In this way, the resistor 24 may be bypassed from the time the shutdown signal rises until a predetermined delay time elapses. After the predetermined delay time, the bypass circuit turns off so that the bypassing of the resistor 24 ends. When the resistor 24 is bypassed by the bypass circuit 52, the resistance can be made smaller, and thereby, the charge current of the condenser C2 connected to the terminal Tc may be increased and the condenser C2 may be rapidly charged. In turn, the rise time of the applied currents of the non-inverting input terminal of the differential amplifier circuit 21 and the non-inverting input terminal of the differential amplifier circuit 31 may be shortened, and the switches 22 and 32 of the respective amplifier circuits 11 and 12 may be switched on/off more quickly in response to the shutdown signal.

The delay circuit 42 corresponds to a circuit for controlling the mute function, and delays the shutdown signal for a predetermined delay time and outputs the delayed signal as a mute signal. The predetermined delay time is set according to the shutdown signal and corresponds to the time required for the amplifier circuits 11 and 12 to accurately operate after being activated.

Figure 4:
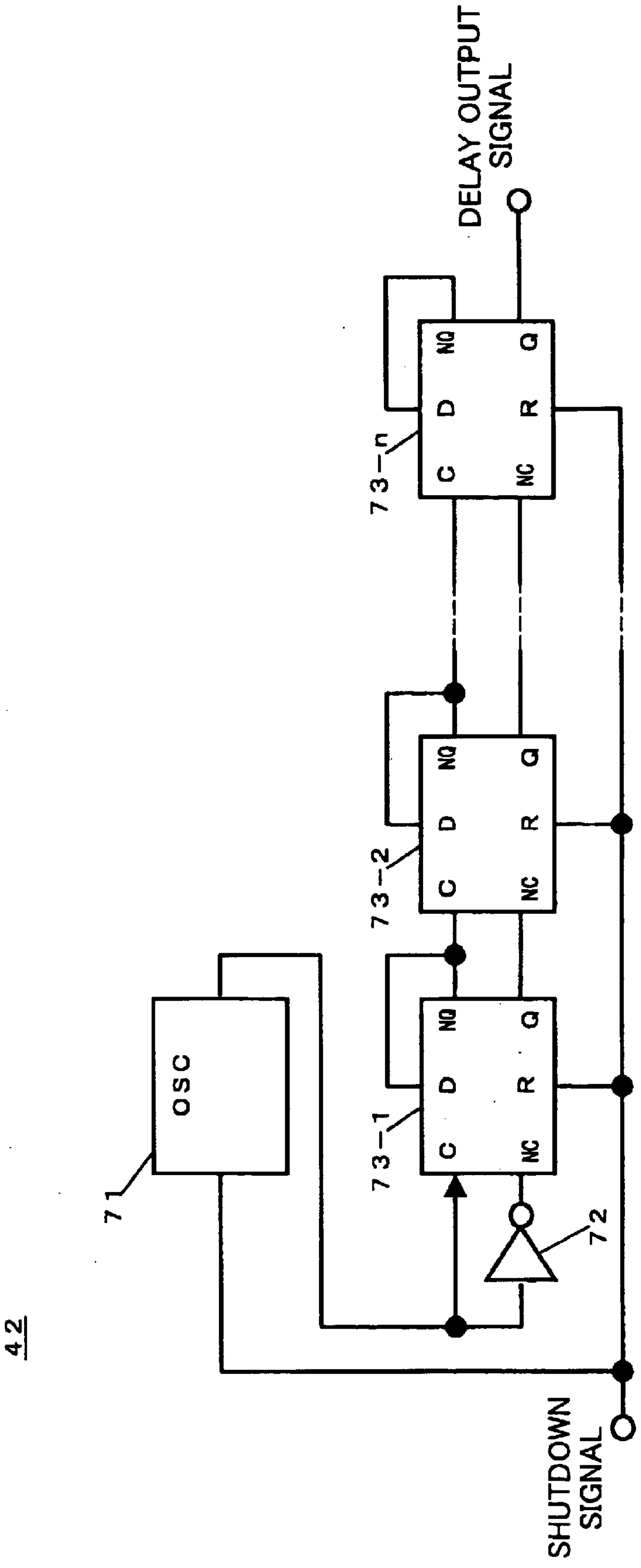
FIG. 4 is a circuit diagram illustrating a configuration of a delay circuit according to an embodiment of the present invention.

FIG. 4 is a block diagram illustrating an exemplary configuration of the delay circuit 42.

The delay circuit 42 may correspond to a logic timer that includes an oscillation circuit 71, an inverter 72, and flip flops 73-1~73-n.

The oscillation circuit 71 may be activated and start oscillating when the level of the shutdown signal supplied to the shutdown control terminal Tsd changes from low to high. The inverter 72 inverts the oscillation output of the oscillation circuit 71 and outputs the resulting signal to the flip flops 73-1~73-n.

The flip flops 73-1~73-n correspond to D flip-flops. The shutdown signal is supplied to respective reset terminals R of the flip flops 73-1~73-n, and the outputs Q of the flip flops 73-1~73-n are reset to low level by the shutdown signal. A clock terminal C of the flip flop 73-1 receives the oscillation output from the oscillation circuit 71, an inverting clock terminal NC of the flip flop 73-1 receives the inverted oscillation output from the inverter 72, and a data terminal D of the flip flop 73-1 is connected to an inverting output terminal NQ. The inverting output terminal NQ is connected to a clock terminal C of the next flip flop 73-2, and a non-inverting output terminal Q of the flip flop 73-1 is connected to the inverting clock terminal NC of the next flip flop 73-2.

The above described connection between the flip flop 73-1 and the flip flop 73-2 is established for the n number of flip-flops. In this way, the so-called up counter may be realized. The output from the non-inverting output terminal Q of the last flip flop 73-n is switched to high level after counting up to the oscillation output of the oscillation circuit 71 $n^2$ times from the time at which the shutdown signal rises. In this way, a delay output of the shutdown signal may be obtained.

As is described above, by configuring the delay circuit 47 to be a logical timer, a more accurate delay time may be set compared to a case in which a condenser is used to set the delay time, for example.

It is noted that in the present embodiment, the delay circuit is configured to be a logical timer; however, the present invention is not limited to this embodiment and any suitable delay circuit may be implemented so long as it is arranged to realize signal delay, for example, through digital processing.

Also, it is noted that the resistors R23 and R24 correspond to a resistor circuit of the present invention, the condenser C2 corresponds to a condenser unit of the present invention, the delay circuit 42 corresponds to a digital delay circuit of the present invention, and the bypass circuit 52 corresponds to a bypass circuit of the present invention.

In the following, an operation of the signal output circuit 1 of the present embodiment is described.

Figures 5A, 5B, 5C, 5D, 5E:
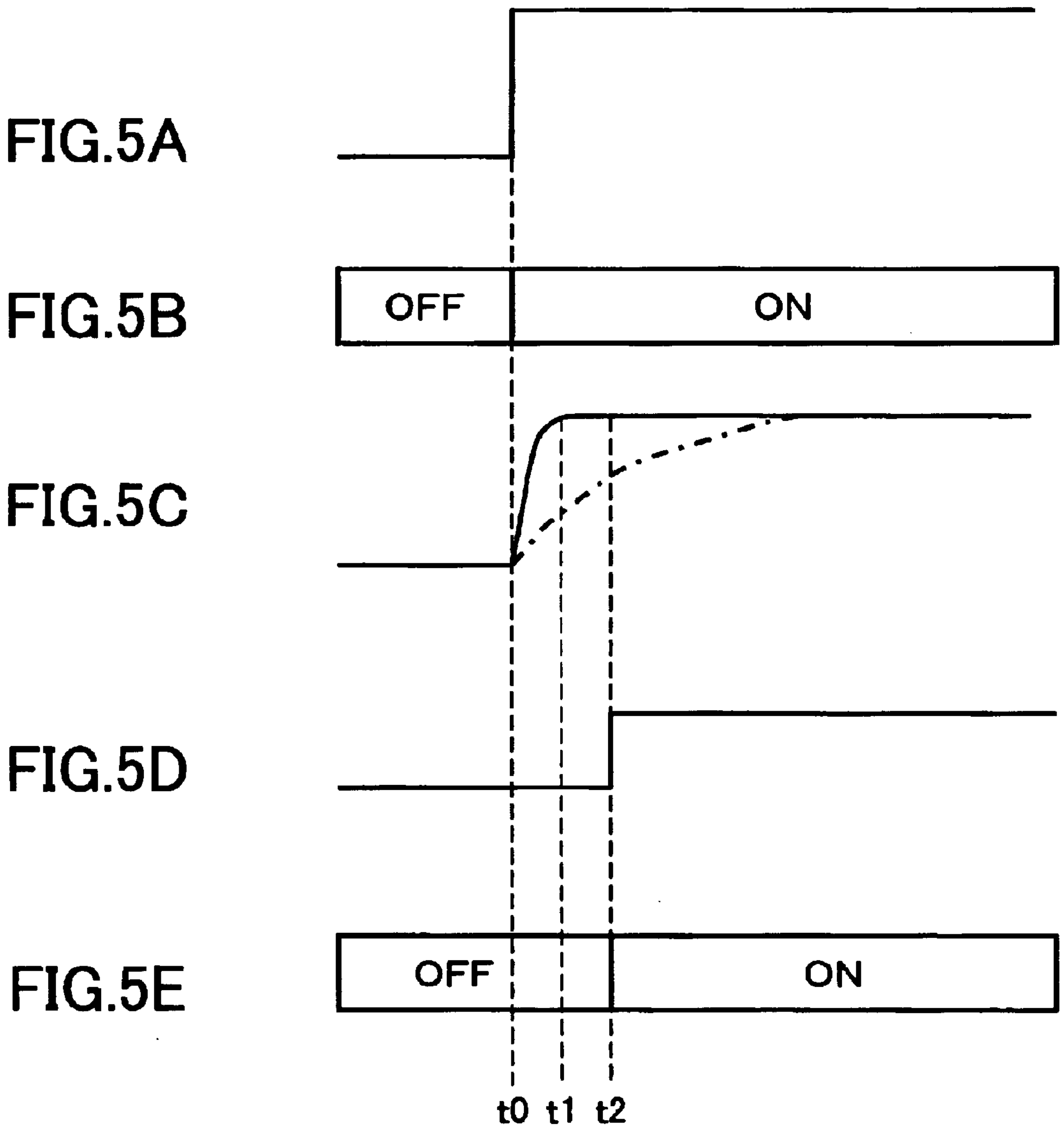
FIGS. 5A~5E are diagrams illustrating an operation of the signal output circuit of FIG. 3.

FIGS. 5A~5E are diagrams illustrating an exemplary operation of the signal output circuit 1 according to the present embodiment. FIG. 5A represents the shutdown signal supplied to the terminal Tsd from the controller 4, FIG. 5B represents the switching state of the switch 51, FIG. 5C represents the standard voltage applied to the non-inverting input terminals of the differential amplifier circuits 21 and 31, FIG. 5D represents the output of the delay circuit 42, and FIG. 5E represents the switching state of the switches 22 and 32.

When the level of the shutdown signal switches from low to high at time t0 as is shown in FIG. 5A, the switch 51 turns on as is shown in FIG. 5B. In this case, the bypass circuit 52 turns on, and thereby, the condenser C2 is rapidly charged so that at time t1, the standard voltage reaches a predetermined level, as is shown in FIG. 5C. The standard voltage is applied to the non-inverting input terminals of the differential amplifier circuits 21 and 31.

At time t2 (>t1 as measured from t0), after a predetermined delay time ΔT elapses from time t0, the output of the delay circuit 42 rises to a high level, as is shown in FIG. 5D, and the switches 22 and 32 are turned on as is shown in FIG. 5E. By turning on the switches 22 and 32, the mute state of the input signal may be disengaged so that the input signal may be amplified at the amplifier circuits 11 and 12 and the resulting signal may be supplied to the speaker 3.

According to the present embodiment, by merely supplying the shutdown signal from the terminal Tsd, the mute state may be switched on/off according to the shutdown signal, and thereby, the number of external terminals may be reduced. Also, the controller 4 generates just the shutdown signal so that the processing load of the controller 4 may be reduced.

Also, by generating the mute signal for controlling the mute state of the input signal through delaying the shutdown signal, the mute state may be controlled according to the shutdown state. Thereby, the input signal may be controlled to be muted when the differential amplifier circuits 21 and 31 are activated/shutdown, and fluctuation of the outputs of the differential amplifier circuits 21 and 31 upon activation/shutdown may be prevented so that smooth operation may be realized.

It is noted that in the standard voltage generating circuit 41 according to the present embodiment, the rise time of the standard voltage to be supplied to the non-inverting input terminals of the differential amplifier circuits 21 and 31 is quickened by simply bypassing the resistor R24. However, in an alternative embodiment of the present invention, the waveform of the rise of the standard voltage may be set by bypassing a plurality of resistors at different timings.

Figure 6:
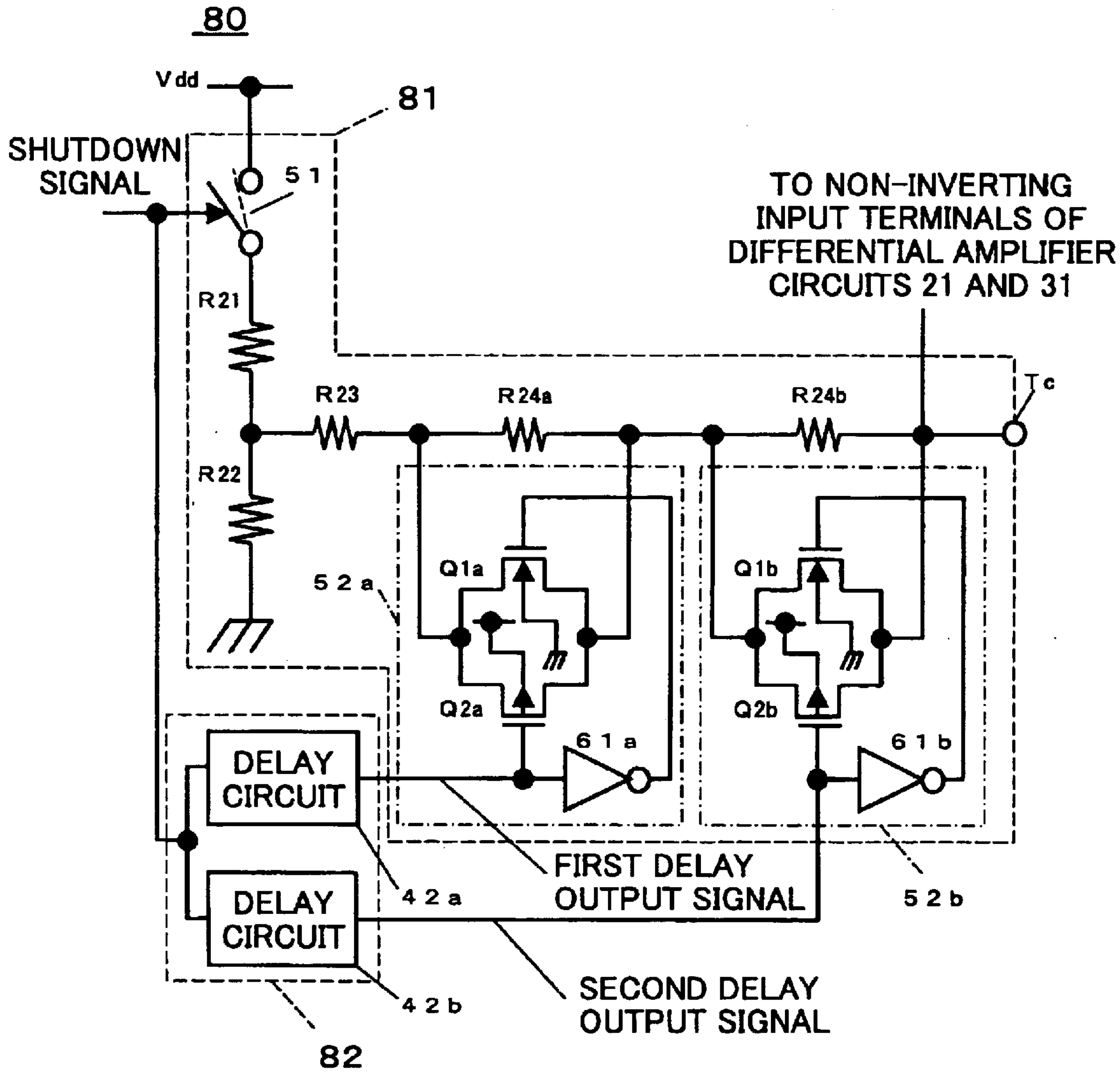
FIG. 6 is a circuit diagram illustrating a configuration of a function control circuit according to a modified embodiment of the present invention.

FIG. 6 is a circuit diagram illustrating a configuration of a function control circuit 80 according to another modified embodiment of the present invention. It is noted that in this drawing, component parts that are identical to those shown in FIG. 3 are assigned the same numerical references and their descriptions are omitted.

The function control circuit 80 of the modified embodiment includes a standard voltage generating circuit 81 that implements resistors R24*a* and R24*b* in place of the resistor R24, and bypass circuits 52*a* and 52*b* for bypassing the resistors R24*a* and R24*b* in place of the bypass circuit 52. Also, a delay circuit 82 of the function control circuit 80 includes a delay circuit 42*a* for delaying the shutdown signal by a first delay time T1, and a delay circuit 42*b* for delaying the shutdown signal by a second delay time T2 that is longer (as measured from t2) than the first delay time T1 (T2>T1). It is noted that each of the delay circuits 42*a* and 42*b* have a configuration that is identical to that shown in FIG. 4 representing the delay circuit 42. More specifically, the delay circuit 42*a* is arranged to have a greater number of connection stages to the D flip-flops compared to the delay circuit 42*b*.

The resistors R24*a* and R24*b* of the standard voltage generating circuit 81 are serially connected between the resistor R23 and the terminal Tc. The bypass circuit 52*a* establishes parallel connection with the resistor R24*a*, and the bypass circuit 52*b* establishes parallel connection with the resistor R24*b*.

The bypass circuit 52*a* has a configuration identical to that of the bypass circuit 52 shown in FIG. 3, and includes MOS field effect transistors Q1*a* and Q2*a* that configure a CMOS structure forming a transfer gate, and an inverter 61*a*. The bypass circuit 52*a* is switched on after the first delay time elapses from the time the shutdown signal rises, the switching being realized by a first delay output that is supplied from the delay circuit 42*a*. The bypass circuit 52*b* has a configuration identical to that of the bypass circuit 52 shown in FIG. 3, and includes MOS field effect transistors Q1*b* and Q2*b* that configure a CMOS structure forming a transfer gate, and an inverter 61*b*. The bypass circuit 52*b* is switched on after the second delay time passes from the time the shutdown signal rises, the switching being realized by a second delay output that is supplied from the delay circuit 42*b*.

Figures 7A, 7B, 7C, 7D:
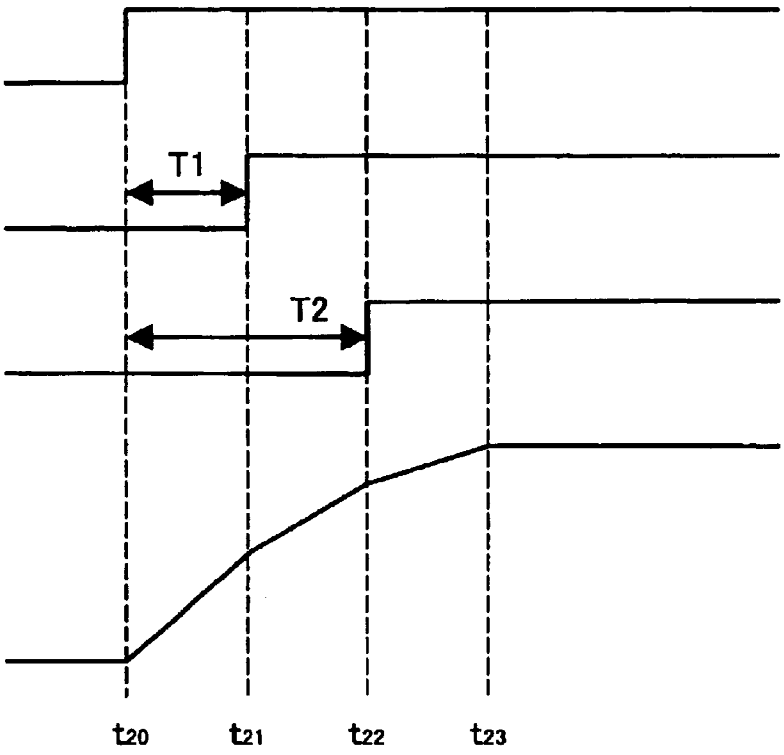
FIGS. 7A~7D are diagrams illustrating an operation of the function control circuit of FIG. 6.

FIGS. 7A~7D are diagrams illustrating a signal output operation according to the modified embodiment. FIG. 7A represents the shutdown signal, FIG. 7B represents the delay output of the delay circuit 42*a*, FIG. 7C represents the delay output of the delay circuit 42*b*, and FIG. 7D represents a waveform of the standard voltage generated at the terminal Tc.

When the shutdown signal rises at time t20 as is shown in FIG. 7A, the switch 51 turns on. At this time, the delay outputs of the delay circuits 42*a* and 42*b* are at low levels, and thereby, the bypass circuits 52*a* and 52*b* are turned on so that the resistors R24*a* and R24*b* are bypassed in charging the condenser C2. In this way, the standard voltage generated at the terminal Tc rises rapidly as is shown in FIG. 7D.

The shutdown signal rises at time t20, and at time t21, after the first delay time T1 elapses, the delay output of the delay circuit 42*a* rises as is shown in FIG. 7B. When the delay output of the delay circuit 42*a* rises, the bypass circuit 52*a* turns off. In turn, when the bypass circuit 52*a* turns off, the condenser C2 is charged via the resistor R24*a*. Thereby, the rise of the standard voltage generated at the terminal Tc is slowed down as is shown in FIG. 7D.

At time t22, after the second delay time T2 elapses from the time t20 at which the shutdown signal rises, the delay output of the delay circuit 42*b* rises as is shown in FIG. 7C. When the delay output of the delay circuit 42*b* rises, the bypass circuit 52*b* turns off. When the bypass circuit 52*b* turns off, the condenser C2 is charged via the resistors R24*a* and R24*b* so that the rise of the standard voltage generated at the terminal Tc is slowed down further as is shown in FIG. 7D.

When the condenser C2 is charged at time t23, the standard voltage generated at the terminal Tc reaches a fixed level.

In such case, the rise of the standard voltage generated at the terminal Tc may be adjusted to have a desired waveform by implementing the resistors R24a and R24b, and setting the first delay time T1, and the second delay time T2. Thus, for example, the first delay time and the second delay time may be set to have different durations so that the rise of the standard voltage generated at the terminal Tc may be quickened while reducing shock generated upon the rise of the voltage. In this way, the differential amplifier circuits 21 and 31 may be rapidly activated/shutdown while shock that may be generated upon the rise/fall of the voltage is reduced so that such operations are realized without much generation of noise such as shock noise.

It is noted that in the present embodiment, two bypass circuits 52a and 52b are implemented for bypassing two serial resistors R24a and R24b, respectively, to enable adjustment of the rise of the standard voltage in three stages. However, the present invention is not limited to this embodiment, and the number of serial resistors implemented may be increased so that the rise of the standard voltage may be realized in a greater number of stages.

Also, it is noted that in the present embodiment, the bypass circuits are implemented parallel to the serial resistors; however, the bypass circuits may also be serially connected to parallel resistors, for example, to adjust the rise of the standard voltage.

The present application is based on and claims the benefit of the priority date of Japanese Patent Application No.2003-282845 filed on Jul. 30, 2003, the entire contents of which are hereby incorporated by reference.

What is claimed is:

1. A voltage generating circuit that generates an output voltage according to an input voltage, the voltage generating circuit comprising:

a resistor circuit that is serially implemented with respect to the input voltage;

a condenser unit that cooperates with the resistor circuit to generate the output voltage;

a digital delay circuit that delays at least one of a rise and a fall of the input voltage and generates a delay output based thereon; and a bypass circuit that controls bypassing of a predetermined resistor included in the resistor circuit according to the delay output of the digital delay circuit.

2. The voltage generating circuit as claimed in claim 1, wherein:

the resistor circuit includes a plurality of resistors that are serially connected; and the bypass circuit establishes parallel connection with the predetermined resistor that is to be bypassed, and includes a switch that is switched according to the delay output of the digital delay circuit.

3. The voltage generating circuit as claimed in claim 1, wherein:

the delay output of the digital delay circuit controls the bypassing of the predetermined resistor to be performed for a period of time during which the output voltage generated according to the input voltage is rising to a predetermined voltage.

4. The voltage generating circuit as claimed in claim 1, wherein:

the bypass circuit controls bypassing of a plurality of resistors included in the resistor circuit according to delay outputs of a plurality of digital delay circuits having differing delay times.

5. A method of generating an output voltage according to an input voltage, wherein a resistor circuit is serially implemented with respect to the input voltage, the method comprising the steps of:

delaying at least one of a rise and a fall of the input voltage and generating a delay output based thereon;

controlling bypassing of one or more resistors included in the resistor circuit according to the delay output; and adjusting a rise of the output voltage during bypass of the one or more resistors.

* * * * *